United States Patent
Noji et al.

(10) Patent No.: US 7,952,071 B2
(45) Date of Patent: May 31, 2011

(54) APPARATUS AND METHOD FOR INSPECTING SAMPLE SURFACE

(75) Inventors: Nobuharu Noji, Tokyo (JP); Yoshihiko Naito, Tokyo (JP); Hirosi Sobukawa, Tokyo (JP); Masahiro Hatakeyama, Tokyo (JP); Kenji Terao, Tokyo (JP); Takeshi Murakami, Tokyo (JP); Katsuya Okumura, Tokyo (JP); Tatsuhiko Higashiki, Tokyo (JP)

(73) Assignees: Ebara Corporation, Tokyo (JP); Kabushiki Kaisha Toshiba, Tokyo (JP)

( * ) Notice: Subject to any disclaimer, the term of this patent is extended or adjusted under 35 U.S.C. 154(b) by 371 days.

(21) Appl. No.: 12/162,071

(22) PCT Filed: Jan. 24, 2007

(86) PCT No.: PCT/JP2007/051045
§ 371 (c)(1),
(2), (4) Date: Jul. 24, 2008

(87) PCT Pub. No.: WO2007/086398
PCT Pub. Date: Aug. 2, 2007

(65) Prior Publication Data
US 2009/0026368 A1 Jan. 29, 2009

(30) Foreign Application Priority Data
Jan. 25, 2006 (JP) .................. 2006-016553

(51) Int. Cl.
*G01N 23/00* (2006.01)
(52) U.S. Cl. .................. 250/310; 250/307
(58) Field of Classification Search .......... 250/306, 250/307, 310, 311, 397, 492.2, 492.22, 492.3; 324/500, 501, 750, 751, 753, 765
See application file for complete search history.

(56) References Cited

U.S. PATENT DOCUMENTS
6,476,388 B1 * 11/2002 Nakagaki et al. ........... 850/9
(Continued)

FOREIGN PATENT DOCUMENTS
JP 11-135056 A 5/1999
(Continued)

OTHER PUBLICATIONS
International Search Report of PCT/JP2007/051045, date of mailing Apr. 10, 2007.

*Primary Examiner* — Bernard E Souw
(74) *Attorney, Agent, or Firm* — Westerman, Hattori, Daniels & Adrian, LLP

(57) ABSTRACT

Provided is a defect inspection apparatus and an inspection (or evaluation) method with highly improved accuracy, which would not be provided by the prior art, in the defect inspection apparatus used in a manufacturing process of a semiconductor device.

Provided is a method for inspecting a sample surface with a projection type electron beam inspection apparatus, comprising the steps of: forming such an irradiation area on the sample surface by an electron beam generated from an electron gun 21 that has approximately a circular or elliptical shape of a size larger than a pattern on the sample surface; irradiating the electron beam substantially onto a center of the pattern on the sample surface; and forming an image on an electron detection plane of a detector from secondary electrons emanating from the sample surface in response to the irradiation of the electron beam for inspecting the sample surface.

4 Claims, 7 Drawing Sheets

U.S. PATENT DOCUMENTS

| | | | |
|---|---|---|---|
| 6,559,663 B2 * | 5/2003 | Shinada et al. | 324/751 |
| 6,992,290 B2 * | 1/2006 | Watanabe et al. | 250/310 |
| 7,034,298 B2 * | 4/2006 | Miyai et al. | 250/310 |
| 7,157,703 B2 * | 1/2007 | Nakasuji et al. | 250/311 |
| 7,223,973 B2 * | 5/2007 | Kimba et al. | 250/307 |
| 2002/0027440 A1 | 3/2002 | Shinada et al. | |
| 2002/0088940 A1 | 7/2002 | Watanabe et al. | |
| 2003/0169060 A1 * | 9/2003 | Shinada et al. | 324/751 |
| 2004/0159787 A1 | 8/2004 | Nakasuji et al. | |
| 2005/0121611 A1 * | 6/2005 | Kimba et al. | 250/311 |
| 2005/0146714 A1 | 7/2005 | Kitamura et al. | |
| 2005/0194535 A1 | 9/2005 | Noji et al. | |
| 2009/0050802 A1 * | 2/2009 | Noji et al. | 250/307 |

FOREIGN PATENT DOCUMENTS

| | | |
|---|---|---|
| JP | 2000-231895 A | 8/2000 |
| JP | 2001-357808 A | 12/2001 |
| JP | 2002-118158 A | 4/2002 |
| JP | 2002-216692 A | 8/2002 |
| JP | 2002-216694 A | 8/2002 |
| JP | 2004-095281 A | 3/2004 |
| JP | 2005-235777 A | 9/2005 |
| JP | 2005-249745 A | 9/2005 |
| JP | 2005-277395 A | 10/2005 |

* cited by examiner

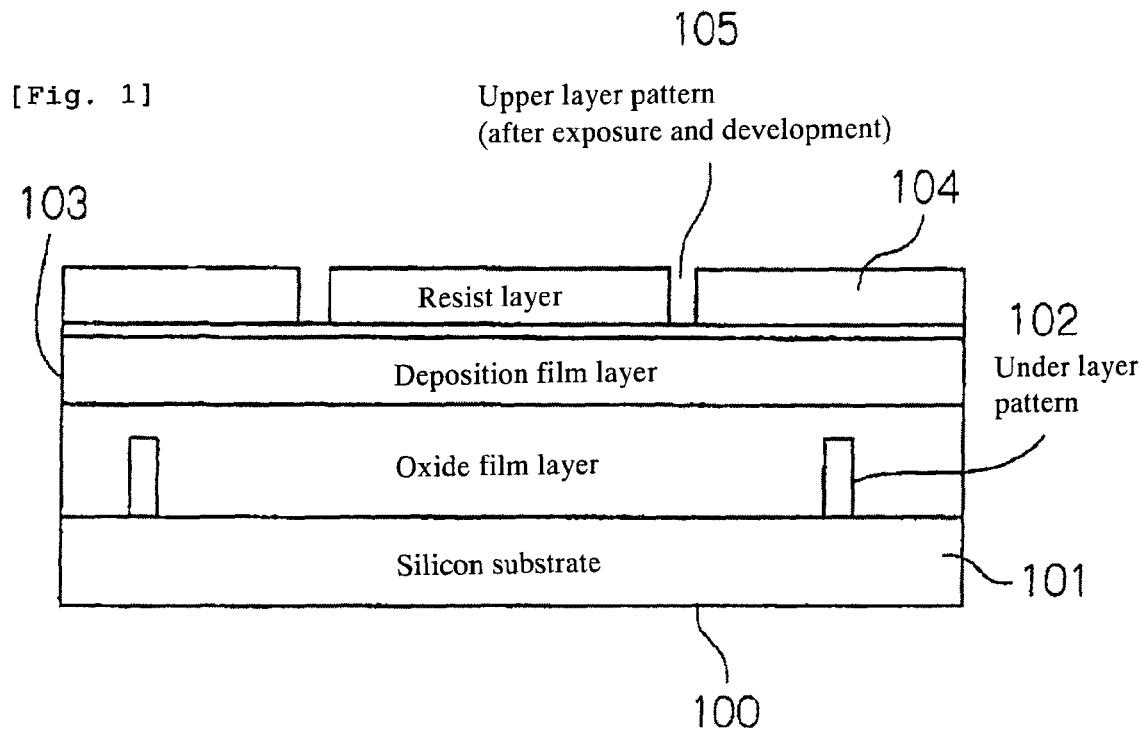
[Fig. 1]
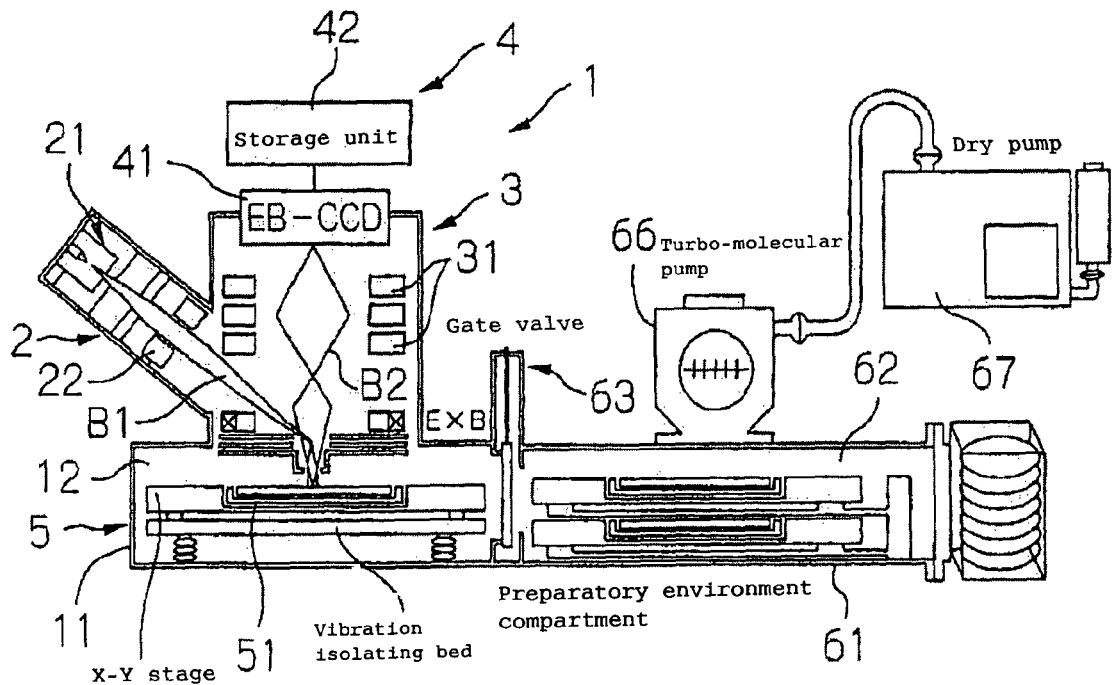
[Fig. 2]

[Fig. 3]
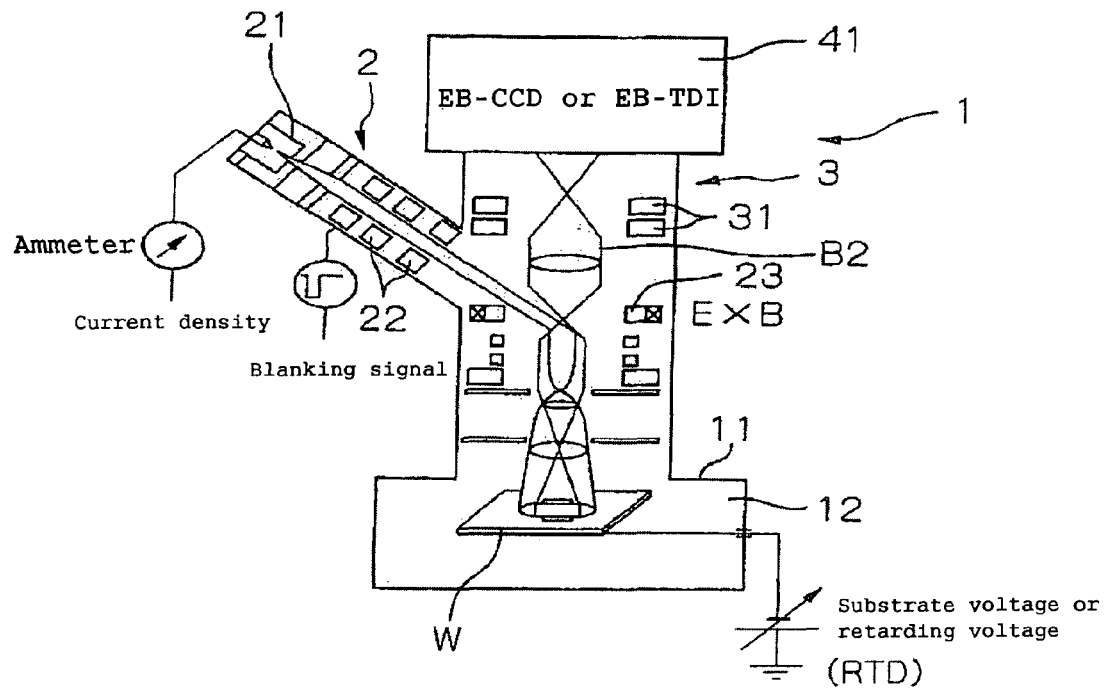
[Fig. 4]
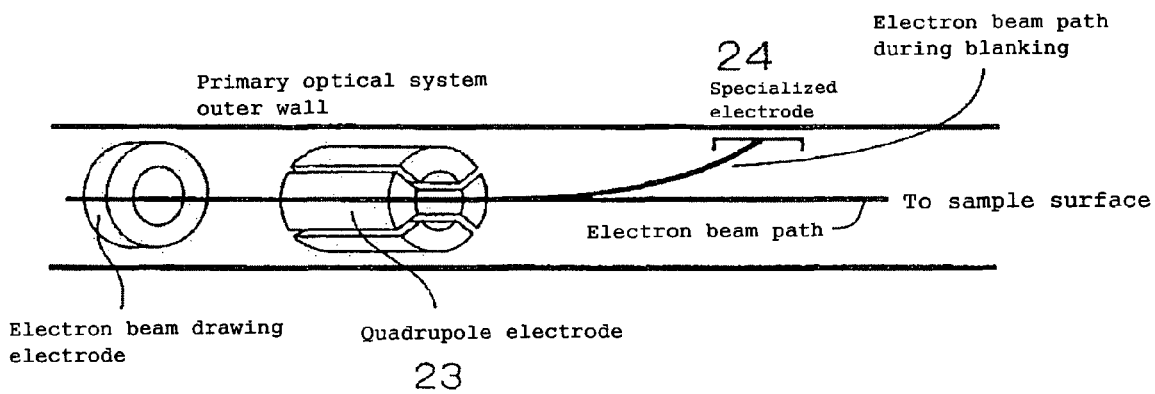

[Fig. 5]
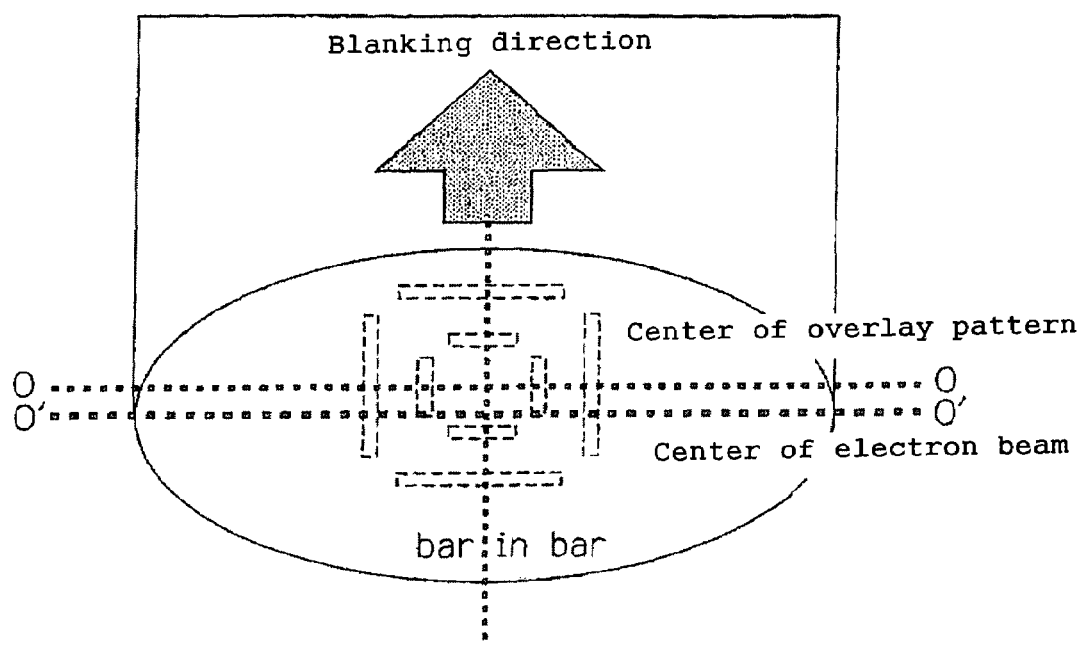
[Fig. 6]
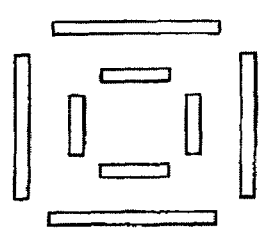
bar in bar
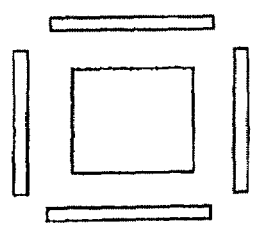
bar in box
Overlay pattern

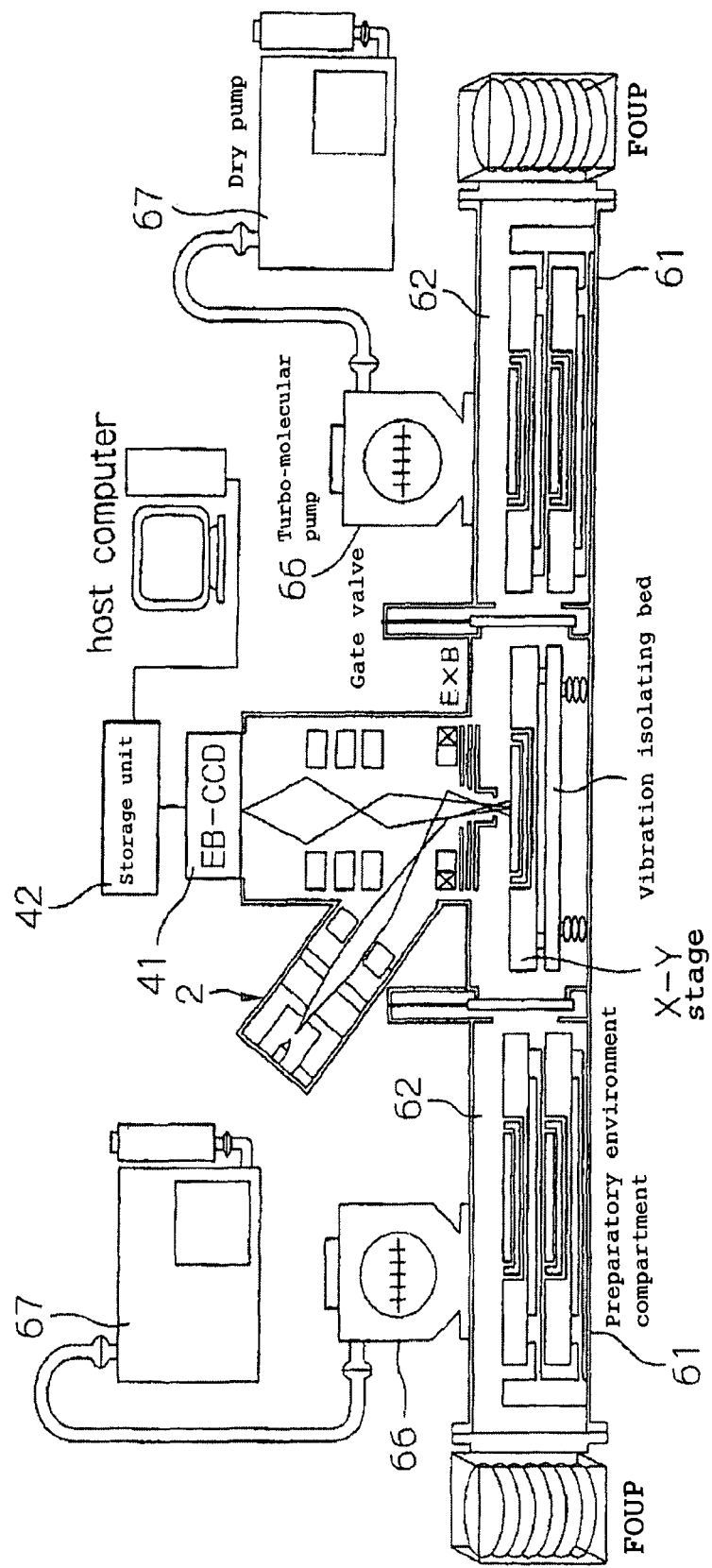
[Fig. 7]

[Fig. 8]
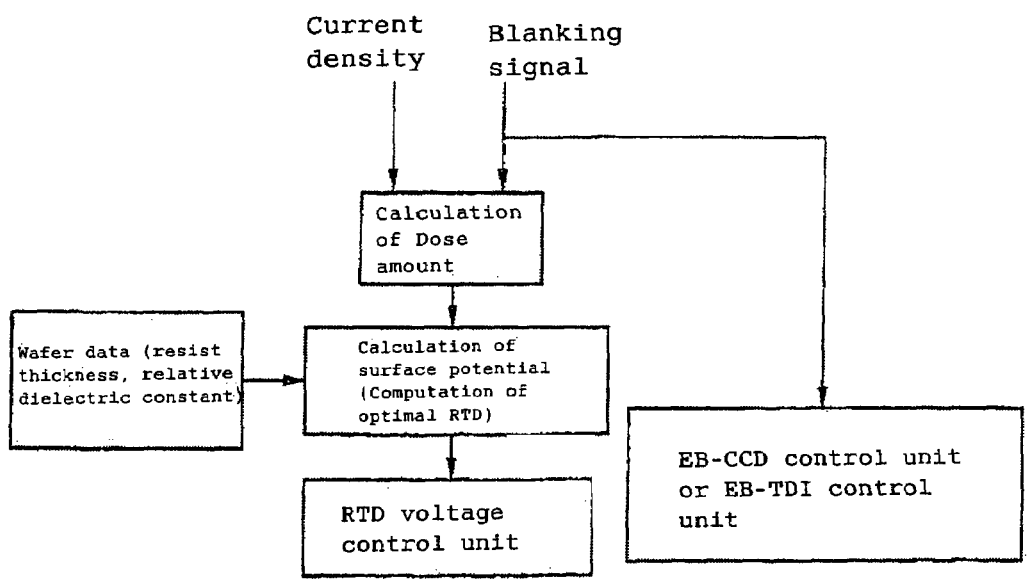
[Fig. 9]
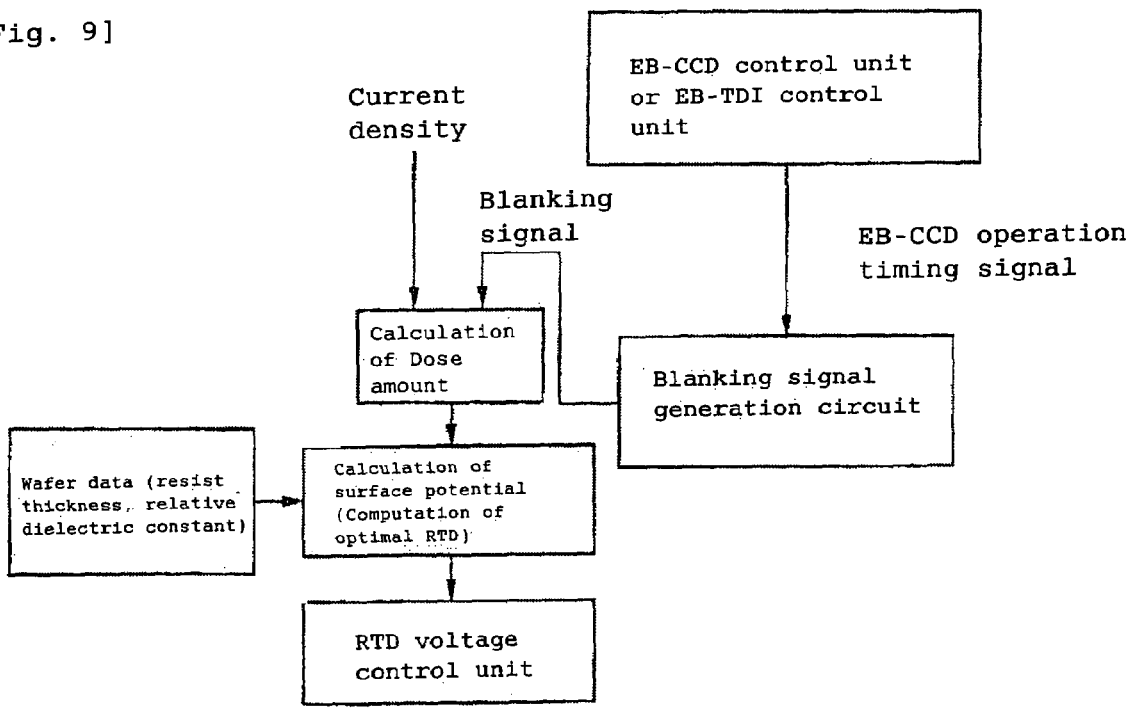

[Fig. 10]
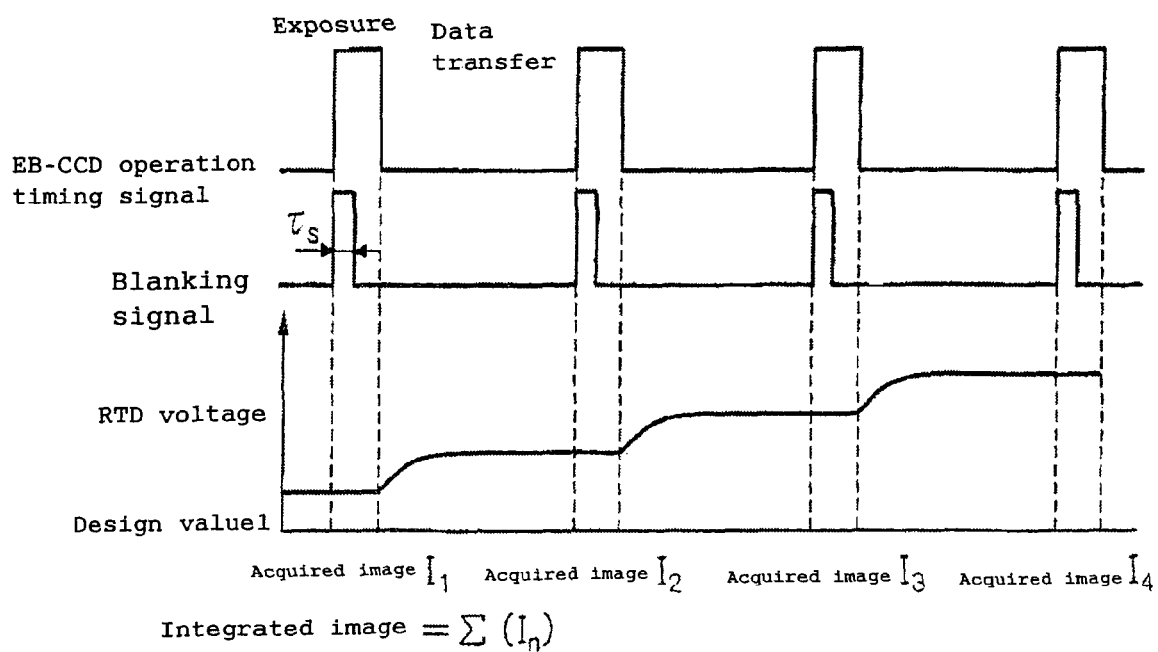

[Fig. 11]
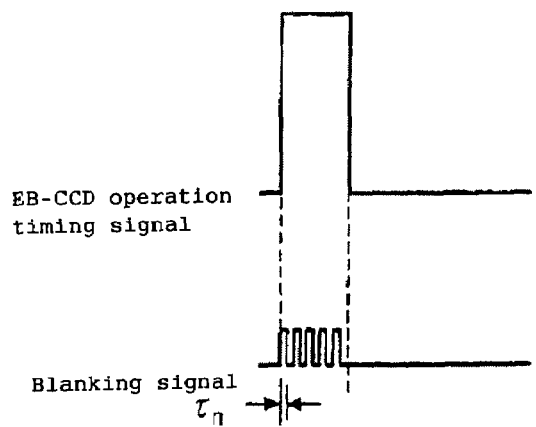
[Fig. 12]
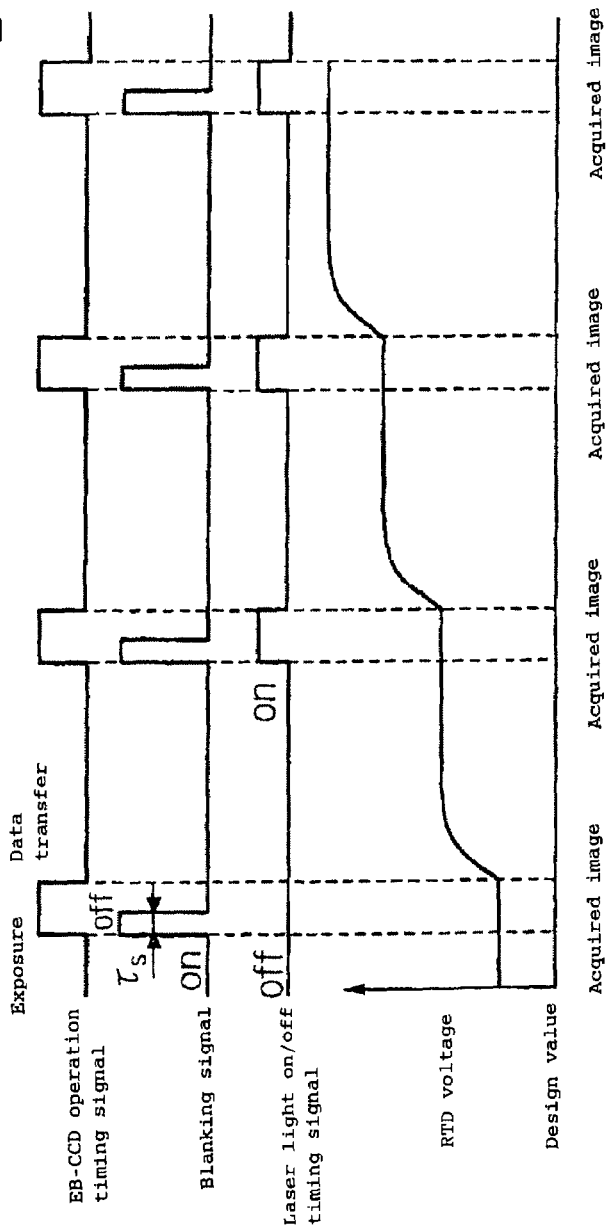

APPARATUS AND METHOD FOR INSPECTING SAMPLE SURFACE

FIELD OF THE INVENTION

The present invention relates to an apparatus and a method for inspecting a sample surface and in particular, to a projection type electron beam inspection apparatus for sample surface for inspecting or evaluating a surface of a sample, such as a wafer and a substrate, by irradiating an electron beam thereto, and a method for inspecting or evaluating a sample surface by using such an inspection apparatus.

BACKGROUND ART

A semiconductor manufacturing process involves the steps of exposing, etching, and thin-film deposition, which steps are repeated several or a dozen times. One critical factor in these steps is matching (overlay) of locations between a wiring pattern formed in an under layer and a wiring pattern to be formed in an upper layer in a plurality of wiring patterns stacked one on top of the other.

In a conventional approach, matching has been provided by making an alignment (an overlay inspection) by means of a light (an optical microscope and so on) in conjunction with a mark of a specified purpose (an overlay mark) employed for alignment of the locations between the pattern in the under layer and the pattern in the upper layer.

REFERENCE

Patent document: U.S. Pat. No. 6,091,249

DISCLOSURE OF THE INVENTION

Problem to be Solved by the Invention

Since the overlay mark has a different pattern size from that of the actual device, such an overlay inspection as described above is subject to an effect of coma aberration from the light, often resulting in an alignment disclination in which the actual device pattern is shifted and exposed to the light, even if the overlay mark is within a tolerance range in the alignment.

The present invention has been made in light of the problems as pointed above and an object thereof is to provide a defect inspection apparatus and an inspection (or evaluation) method with highly improved accuracy which would not be provided by the prior art, in the defect inspection apparatus used in a manufacturing process of a semiconductor device.

Another object of the present invention is to provide a surface inspection apparatus of a projection type or an inspection method with an improved accuracy in the overlay inspection by using a larger irradiation area on a sample surface by an electron beam as compared to a pattern size.

Means to Solve the Problem

To accomplish the objects stated above, the present invention as defined in claim 1 provides a method for inspecting a sample surface with a projection type electron beam inspection apparatus, the sample surface inspection method characterized in comprising the steps of: forming such an irradiation area on the sample surface by an electron beam generated from an electron gun that has approximately a circular or elliptical shape of a size larger than a pattern on the sample surface; irradiating the electron beam substantially onto a center of the pattern on the sample surface; and forming an image on an electron detection plane of a detector from secondary electrons emanating from the sample surface in response to the irradiation of the electron beam for inspecting the sample surface.

According to the present invention as defined in claim 2, the detector may be an Electron Bombardment-Charge Coupled Device (EB-CCD).

According to an embodiment of the present invention, provided is a surface inspection apparatus of a projection type using an electron beam to inspect a surface of a sample, the apparatus characterized in comprising: an electron gun for emitting an electron beam; a primary optical system having at least one electrostatic lens for forming the electron beam substantially into a circular or elliptical shape and also making a size of an irradiation area by the electron beam larger than that of a pattern on the sample surface, and adapted to guide the electron beam onto the sample surface; a secondary optical system having an electrostatic lens for accelerating secondary electrons emanating from the sample surface and at least one electrostatic lens for forming an image of the accelerated secondary electrons on a detection plane of a detector for detecting the secondary electrons; a conversion unit for converting the secondary electrons that have been formed into the image, into an imaging electric signal; and a mechanism for modifying a sample voltage or a retarding voltage in response to an intensity of the electron beam irradiated onto the sample surface.

In an apparatus and a method for inspecting a sample surface according to the present invention as designated above, the secondary optical system for guiding, into the detector, the secondary electrons emanating from the surface of the sample, such as a semiconductor wafer, in response to the irradiated electron beam onto the sample surface may include a quadrupole lens and the method may further include a step of forming an image on the detector by a plurality of electrostatic lenses.

Further, the detector for detecting the secondary electrons emanating from the semiconductor wafer may comprise a Multi Channel Plate (MCP) and a Time Delay Integration-Charge Coupled Device (TDI-CCD).

In addition to the MCP and TDI-CCD, the detector for detecting the electrons may comprise a fluorescent screen between the MCP and the TDI-CCD.

The detector may comprise an Electron Bombardment-Time Delay Integration (EB-TDI) instead of the MCP and TDI-CCD, and further it may comprise an EB-CCD.

EFFECT OF THE INVENTION

The present invention allows the overlay to be detected in the manufacturing of a semiconductor device, thus achieving a defect inspection with high accuracy in the manufacturing of the semiconductor device.

BRIEF DESCRIPTION OF THE DRAWINGS

FIG. 1 is a conceptual diagram of overlaying;

FIG. 2 is a schematic diagram of an example of an apparatus embodying a surface inspection method of the present invention;

FIG. 3 depicts main components from FIG. 2 in detail;

FIG. 4 is a conceptual diagram of a blanking operation;

FIG. 5 shows a blanking direction and an electron beam irradiation area;

FIG. 6 shows an overlay pattern;

FIG. 7 shows an example of a surface inspection apparatus having a plurality of preparatory environment compartments;

FIG. 8 is a flow chart for controlling a substrate voltage or a retarding voltage;

FIG. 9 is another flow chart for controlling a substrate voltage or a retarding voltage;

FIG. 10 shows a relationship among a substrate voltage or a retarding voltage, an EB-CCD and a blanking signal;

FIG. 11 shows another example of a blanking signal: and

FIG. 12 shows a relationship between a laser light irradiation and a blanking signal.

LIST OF REFERENCE NUMERALS

1 Sample surface inspection apparatus
2 Primary optical system
3 Secondary optical system
4 Detection system
5 Staging unit
12 Chamber
21 Electron gun
23 ExB filter
41 Detector
42 Storage unit

BEST MODE FOR CARRYING OUT THE INVENTION

An embodiment of a method for inspecting a sample surface according to the present invention will be described below with reference to the attached drawings.

First referring to FIG. 1, there is shown a conceptual diagram illustrating an overlay inspection. In FIG. 1, reference numeral 100 designates a silicon substrate, 101 an oxide film layer, 102 an under layer pattern, 103 a deposition film layer, and 104 a resist layer after having been exposed to a light and then developed. A semiconductor manufacturing process involves a number of etching processes. An etching process provides the steps of applying a resist over a deposition film to be desirably etched, for example, the oxide film 103; exposing the resist to a light or an electron beam and then developing it so as to form it into a desired pattern as shown by the resist layer 104; and etching and thereby removing a portion of the deposition film, for example, the oxide film that is not covered with the resist layer so as to form it into a desired pattern.

Over the pattern 102 that has been created in the first etching process, the step of burying and deposition of a new film is applied, and the thus formed film will again need to be processed by etching. In this stage, the pattern (an under layer pattern) 102 that has been created in the previous process and a pattern (an upper layer pattern) 105 that will be newly created by etching must be in conformity to each other in accordance with a design. To address this, a mark for alignment is used to inspect the conformity between the under layer pattern 102 and the upper layer pattern 105.

Since the resist has been already applied over the under layer pattern for the etching of the upper layer pattern, the under layer pattern needs to be viewed or observed through the resist. Further, the inspection of the overlay requires that the upper layer pattern and the under layer pattern must be viewed or observed simultaneously.

In the overlay inspection, primarily, the under layer pattern may often reside beneath the resist or the oxide film. Occasionally, it may reside beneath a conductive layer. Primarily, the upper layer pattern may be formed by exposing the resist to a light, which can be accomplished by exposure only, or by the steps carried out up to the post-baking or up to the development stage.

An embodiment of a method for inspecting a sample surface for any defect or the like according to the present invention will be described below.

Referring now to FIG. 2, an entire apparatus for implementing a surface inspection method for inspecting a sample surface for any defect is described by reference numeral 1. In FIG. 2, reference numeral 2 designates a primary electrooptical system (hereinafter, simply referred to as a primary optical system), 3 a secondary electrooptical system (hereinafter, simply referred to as a secondary optical system), 4 a detection system, 5 a stage unit disposed on a vibration isolating bed having a known structure, all of which are contained in a housing 11 defining a chamber 12. The chamber 12 is constructed such that it can be controlled to have a desired atmosphere, a vacuum atmosphere, for example, by a device though not shown.

A sample "W", such as a wafer or a substrate (the following description of the present embodiment is directed to an example using the wafer as the sample) may be securely but removably placed on a wafer holding table 51 in the stage unit 5 having a known structure and functions by a known means, such as a chuck, for example. The wafer holding table 51 is configured to move serially or in a step-and-repeat manner in at least one direction of two orthogonal axial directions, or X and Y directions. A vibration proofing structure of the vibration isolating bed may be formed from a non-contacting bearing.

As shown in detail in FIG. 3, an electron gun 21 of the primary optical system for irradiating a primary electron beam may use an electron gun of a thermionic emission type or a Schottky type. The primary electron beam "B1" emitted from the electron gun 21 will have its configuration shaped properly via a quadrupole lens 22 and the like of the primary optical system and then irradiated onto the surface of the sample or the wafer W placed on the wafer holding table 51. In this stage, the primary electron beam is guided through an ExB filter or Wien filter 23 comprising an electric field and a magnetic field to the wafer surface.

An electron beam may be shaped by the lens of the primary optical system such that a size of an irradiation area on the sample is larger than that of a pattern in the sample surface, especially the pattern size of the overlay pattern. Further, the electron beam is shaped such that it has substantially a circular or elliptical shape and generally, it has uniformly distributed beam intensity. The electron beam is irradiated substantially onto a center of the overlay mark. The irradiation of the electron beam onto the sample surface is provided by a blanking electrode 23 located in the middle of the primary optical system 2, as shown in FIG. 4. When the electron beam is to be irradiated onto the sample surface, the voltage at the electrode is set to 0V (zero volt) or to a voltage level required to control the path of the electron beam, and the electron beam is advanced substantially centrically through the primary optical system. If the electron beam is not intended to irradiate the sample surface, a sufficient voltage to divert the electron beam completely out of the primary optical system is applied to the blanking electrode 23 so as to guide the electron beam to an outer wall constituting the primary optical system or a specialized electrode 24 or the like to achieve blanking for preventing the electron beam from being irradiated onto the sample surface. The blanking electrode may be constructed from a quadrupole electrode. The direction of deflection of the electron beam may be either of the orthogonally crossing X direction or Y direction, or the diagonal direction (including an X-directional component and a Y-directional component).

Owing to the deflection of the beam, the sample surface is subject to the irradiation of the beam having a slightly high density of distribution in the direction of the deflected electron beam. This may lead to a small bias in the charged condition over the sample surface and thus to missing of horizontal and vertical symmetry of a resultant image. FIG. 5 shows a conceptual diagram illustrating the blanking direction and the electron beam irradiation area.

The irradiation point of the electron beam should be previously determined to be shifted from the center of the overlay mark in the sample surface (as indicated by the centerline O-O in FIG. 5) to a direction substantially opposite to the deflecting direction (blanking direction) of the electron beam (as indicated by the centerline O'-O' in FIG. 5) so as to avoid the bias in the charged condition over the sample surface. Further, in order to reduce the bias in the charged condition over the sample surface by the blanking, a voltage applied to an electrode 25 (FIG. 4) for drawing the electron beam may be modified in the blanking operation to reduce the amount of the electron beam to be drawn, or to prohibit the drawing of the electron beam in an extreme case. In consideration of the symmetry of the obtained image, preferably the blanking may be performed in the X or Y direction.

FIG. 6 shows an overlay mark or an overlay pattern. The overlay mark may employ a bar-in-bar type or a bar-in-box type pattern. The outer bars represent an under layer pattern below a resist layer and the inner bars or box represent the resist pattern, which may have undergone the steps up to exposure, up to exposure and PEB (and heating), or up to development. The under layer pattern may be an STI structure or may be a metal wiring or a trench structure.

Secondary electrons "B2" are generated from the surface of the wafer W in response to the irradiation of the primary electron beam, by an amount corresponding to the energy of the primary electron beam. Those secondary electrons are accelerated by an electrode located adjacent to the wafer toward the defector side until the secondary electrons have a predetermined amount of kinetic energy. The accelerated secondary electrons B2 go straight through the ExB filter or Wien filter 23 comprising the electric field and the magnetic field as described above, and are guided to the secondary electrooptical system (hereinafter simply referred to as the secondary optical system) 3. In this stage, the wafer surface could have been charged by the irradiation of the primary electron beam, and consequently the secondary electrons may occasionally fail in acceleration to the predetermined amount of kinetic energy. In this case, the secondary electrons could not be successfully formed into an image on a detection plane of a detector 41, resulting in no image obtained or an unfocused image. To address this, a charging amount from the electron beam irradiation over the wafer surface should be previously calculated, and a sample voltage or a retarding voltage should be modified adaptively in dependence on the calculated charging amount. This enables the secondary electrons to be accelerated to the predetermined amount of kinetic energy by taking the amount of charging from the electron beam irradiation into account.

Secondary electrons are formed into an image on the detector 41 as a projection image by the secondary optical system 3. The electric lens or electrostatic lens 31, or a component of the secondary electrooptical system 3, comprises plural sheets of coaxially located electrodes having apertures or a plurality of electrode groups disposed coaxially, wherein a certain number of thus configured lenses are arranged in a multi-level. The electric lens serves to enlarge image data possessed by the secondary electrons, while guiding it to the detector as projection data so as not to lose position and surface data on the wafer W.

The detector 41 may comprise a MCP (Multi Channel Plate) in conjunction with a fluorescent screen and a TD-CCD or EB-CCD or EB-TDI. The electrons multiplied by the MCP are then converted to light in the fluorescent screen, which light signal is taken by the TDI-CCD and output as an image signal. Alternatively, the secondary electrons may be directly introduced into the EB-CCD for converting into the image signal.

It is to be noted that each of the components of the primary and the secondary optical systems as well as the detecting system may have a known structure and function, and so any further description should be herein omitted.

The stage unit 5 for holding the wafer W may have a structure to provide a serial movement if the detector is the TDI-CCD or the EB-TDI. Further, the stage is structured not only to make a serial movement but also to repeat a go-and-stop motion in case of the detector implemented by the TDI-CCD or the EB-TDI.

If the detector is the CCD or the EB-CCD, the stage is also allowed to repeat the go-and-stop motion.

The position of the stage is always measured by a laser interferometer, though not shown, in a known method, and a current value of the position given by the measurement from the laser interferometer is compared to a predetermined target value, and based on a resultant residual error, a signal for correcting the residual error is sent to an electrostatic lens control unit (not shown) of the secondary optical system 3. A correction mechanism is provided, in which a moving and stopping motion or a speed fleck and minute vibration during these motions may be corrected by modifying the path of the secondary electrons by means of the electrostatic lens as described above, so that a stable image-forming condition can be always provided on the detection plane of the detector. The stage unit is provided with a brake system (not shown), and the brake system may be used upon stopping of the stage so as to reduce or even eliminate any minute vibration during stopping motion.

The electric image data obtained by the detector 4 is input to an image processing unit, though not shown, where signal processing or image analysis is carried out to identify the location of defect and determine the type of defect, and the result may be notified to an observer, while being stored in a storage media. For the overlay inspection, a shift length in the X and Y directions and a shift amount in a rotational angle (θ) between the under layer pattern and the upper layer pattern are calculated from the image analysis to determine whether the overlay is right or wrong.

The inspection may be selectively performed in an on-line or off-line inspection, and it is also possible in the on-line inspection method to provide a feedback of an inspection result directly to a semiconductor manufacturing line by, for example, an electric signal via a signal line. Further, it is also possible in the off-line inspection method that the inspection result is directly input from a terminal of the inspection apparatus to provide a feedback thereof to the semiconductor manufacturing line by, for example, an electric signal via a signal line. The inspection result may be used for quality control in the course of a manufacturing process via a communication with a host computer in the semiconductor manufacturing line.

With reference to FIG. 2, the description is now directed to an operation for loading the wafer W as before the inspection onto the stage unit 5 within the chamber 12 and unloading the wafer W as after the inspection from the stage unit.

A preparatory environment compartment 62 located adjacent to the chamber 12 of the sample surface inspection apparatus 1 is configured such that in the semiconductor manufacturing process, an environment associated with the wafer carried in from the outside is altered to an environment existing inside the chamber 12 where the stage unit 5 with the wafer holding table 51 is located, until the environment within the preparatory environment compartment 62 is in conformity with the environment inside the chamber 12 to allow the wafer as before the inspection to be carried in from the preparatory environment compartment 62 onto the wafer holding table.

Specifically, a gate valve 63 is disposed between the housing 11 and a housing 61. The housing 11 defines the chamber 12 containing the vibration isolating bed having a known vibration proofing structure, and the stage unit 5 having the wafer holding table 51. The stage unit 5 is disposed on the vibration isolating bed. The housing 61 defines the preparatory environment compartment 62. The chamber 12 and the preparatory environment compartment 62 can be selectively placed in communication with each other or blocked from each other, via the gate valve 63. In addition, another gate valve or flange may be arranged in order to introduce, into the preparatory environment compartment, the wafer in the chamber and the preparatory environment compartment 62. In this regard, when the wafer is transferred between the preparatory environment compartment 62 and the chamber 12 through the gate valve 63, the environments inside both, the chamber and the compartment are kept substantially equal (e.g., in a vacuum atmosphere at a degree of vacuum around $10^{-4}$ Pa to $10^{-6}$ Pa).

Since in the semiconductor manufacturing process, the wafer subject to the inspection before being transferred to a subsequent step is held in an environment suitable for a transfer to the subsequent step, the preparatory environment compartment is firstly controlled to achieve the environment for transferring the wafer to the subsequent step in a known manner by means of a gas supply unit (not shown) and a vacuum evacuation unit, both having a known structure. Once the environment for transferring the wafer to the subsequent step and the environment inside the preparatory environment compartment (vacuum condition) have become equal, another valve or flange operable to introduce the wafer into the preparatory environment compartment is opened to allow the wafer to be introduced into the preparatory environment compartment 62, where the vacuum evacuation system or the gas supply unit as mentioned above is controlled to now achieve the same environment (vacuum condition) as the environment in which the wafer holding table 51 is located or inside the chamber 12.

After that, the gate valve 63 for isolating the chamber 12 from the preparatory environment compartment 62 is opened to allow the wafer W as before the inspection to be transferred onto the wafer holding table 51 (this step is referred to as loading). After the transfer of the wafer as before the inspection having been completed, the gate valve 63 is closed, and the environment in which the wafer holding table is located is adjusted to be suitable for the inspection and then the inspection is started.

When the wafer having finished with the inspection is carried out of the wafer holding table 51 (the operation referred to as unloading) and transferred to the subsequent step, the operation may be carried out in an inverse order to the loading. In this regard, preferably, the vacuum evacuation unit may be implemented by a combination of a turbo-molecular pump 66 with a dry-roots pump 67, but a rotary pump equipped with an oil mist trap or a molecular sieve may be used instead of the dry-roots pump.

FIG. 7 shows an embodiment comprising a plurality (two in the illustrated embodiment) of preparatory environment compartments 62. The loading and the unloading operations of the wafer to be inspected may be carried out concurrently in a parallel manner. In addition, the preparatory environment compartment may have a function for storing a stock consisting of a plurality of wafers at one time. In this case, the number of operations for opening the gate valve may be reduced and so an efficient inspection as well as loading and unloading operations can be achieved.

FIG. 8 shows a control flow of a wafer voltage (also referred to as a substrate voltage, a sample voltage or a retarding voltage, whereas typically referred to as the wafer voltage for the purpose of clarity). The flow as illustrated in FIG. 8 represents the flow in one-shoot image-taking in the Still-mode with the CCD or the EB-CCD or the TDI-CCD. The wafer voltage (the substrate voltage, the sample voltage or the retarding voltage) used herein is referred to as a voltage that is previously applied to a sample, such as a wafer and a substrate.

This represents the embodiment in which a Dose amount (referred to as a dosage of the electron beam, representing an amount of irradiated charges as per a unit area over a sample such as a wafer and a substrate, hereinafter referred to as the Dose amount) is calculated from a signal of current density and a blanking signal so as to control the EB-CCD by using the blanking signal.

A current density "$J_e$" can be computed from an electron current value of an electron gun. The Dose amount for the wafer surface can be calculated from the current density $J_e$ and a blanking cancellation time "$\tau_s$" of the blanking signal.

Wherein, Dose amount=$J_e \cdot \tau_s$

The electrostatic capacity "C" as per unit area in the sample surface, or the wafer surface, can be determined from the data on the wafer surface, for example, a resist thickness "d" and a relative dielectric constant "$\in_r$".

Wherein, $C = \in_r \cdot \in_0 / d$ (unit area is calculated by cm$^2$, $\in_0$ is a dielectric constant in vacuum)

In addition, from CV=Q, a variation in wafer surface voltage $\Delta V = Q/C$, wherein, the wafer surface voltage may be also referred to as a substrate surface voltage or a sample surface voltage, representing a voltage determined by summing up (superposing) an originally applied wafer voltage and a voltage applied through the irradiation of the electron beam to the wafer.

On the other hand, the "Q" represents a total amount of electrons irradiated to the wafer surface and assuming that a secondary electron emission rate is denoted by "γ" at the time of landing energy "LE" (keV), then $Q$=Dose amount$\cdot(1-\gamma)=J_e \cdot \tau_s \cdot (1-\gamma)$ Therefore, the variation in wafer surface voltage can be expressed as follows:

$\Delta V = J_e \cdot \tau_s \cdot (1-\gamma) \cdot d / \in_r \cdot \in_0$

Accordingly, the wafer voltage (or the retarding voltage) RTD should be adjusted to satisfy:

$RTD + \Delta V$=design value (secondary electron drawing voltage).

FIG. 9 shows another control flow of the wafer voltage.

This represents an embodiment for a case where the blanking signal is determined based on the signal from EB-CCD, and the Dose amount is determined from the blanking signal and a current density signal.

FIG. 10 illustrates a relationship among the wafer voltage, the EB-CCD and the blanking signal, when one-shoot image-taking in the Still-mode with the CCD or EB-CCD or TDI-CCD is performed serially a number of times. Since the Dose amount varies at each image-taking operation, the wafer voltage (the retarding voltage) must be adjusted in each case. That is to say, the same image can always be obtained by adjusting the wafer voltage in each case, and integration is applied to those images to obtain an image with high S/N ratio and thus to improve the precision during image analysis.

It is to be noted that the integration may be repeated any number of times as desired. Specifically, an optimal number of times of integration may be previously set according to the specific conditions of the wafer, and so forth. In this way, inspection can be carried out under an optimal inspection condition according to the specific wafer.

FIG. 11 shows another embodiment of the blanking signal. In this embodiment, since a blanking cancellation would occur a number of times during an exposure period to the EB-CCD, the variation in wafer surface voltage $\Delta V$ can be expressed as follows:

$$\Delta V = J_e \cdot \Sigma(\tau_s) \cdot (1-\gamma) \cdot d/\in_r \cdot \in_0$$

In this way, the image can be obtained by adjusting the Dose amount such that the sum of the wafer voltage and the variation in wafer surface voltage can satisfy the image formation condition for the secondary optical system. The exposure period and the blanking cancellation period can be determined relatively as desired. Specifically, the blanking cancellation period may be longer than the exposure period. In this case, to calculate the Dose amount, the exposure time may be substituted for the $\tau_s$.

For the overlay inspection, there may be a case where the condition to determine the $\Delta V$ for viewing the under layer pattern is different from the condition to determine the $\Delta V$ for viewing the upper layer pattern.

If the under layer pattern is in an oxide film or covered with a resist layer, and the upper layer pattern or the resist exposure has been processed simply by the exposure or up to the post-baking, the respective $\Delta V$s depending on the Dose amount are identical to each other, and so the wafer voltage (the retarding voltage) should be set intermediately between the condition to facilitate the viewing of the under layer pattern and the condition to facilitate the viewing of the upper layer pattern.

If the upper layer pattern has been processed up to the development, the principle on which the upper layer pattern is viewed is absolutely different from the principle on which the under layer pattern is viewed. Since the upper layer pattern has an irregular surface created in the development and the image can be acquired in contrast by the geometry, the wafer voltage (the retarding voltage) should be set to a condition favorable for viewing the under layer pattern.

If the image of the upper layer pattern and the image of the under layer pattern can not be obtained concurrently, then the image-taking operation may be carried out by a number of times so that the under layer pattern and the upper layer pattern can be acquired independently. If the image of the upper layer pattern can be obtained as a geometrical contrast or a material contrast after the development or the like, it will be much easier to obtain the image of the upper layer pattern; therefore it is possible that firstly the image of the under layer pattern is obtained preferentially and secondly the image of the upper layer pattern is obtained, and those images are combined to form a synthetic image, from which any misalignment between the under layer pattern and the upper layer pattern can be detected or calculated. In this case, preferably the image-taking operation may be carried out with the image acquiring conditions, especially the RTD or the Dose amount, set to be suitable for the under layer pattern.

Further, if the upper layer pattern has no irregularity in the sample surface, such as a latent image, whichever pattern viewed easily may be processed firstly for obtaining the image.

If the under layer pattern will be vanished first depending on the relation between the RTD and the Dose amount, firstly the condition is set favorably for the under layer pattern and the image is taken from the under layer pattern, and if the upper layer pattern will be vanished first, then firstly the image is taken from the upper layer pattern. If the upper layer pattern image and the lower layer pattern image are taken separately, the RTD may be controlled in dependence on the Dose amount.

Irradiation of laser light may be employed as a method for controlling the $\Delta V$. This irradiation of the laser light can provide a more precise control for a surface potential increment. The laser light is irradiated in advance and then the electron beam is irradiated. The surface potential increment in the sample surface, which could not have been fine-tuned simply through the Dose amount control because the surface potential increment has been modified by a quantum effect from the irradiation of the laser light, can be now successfully tuned, so that a clearer image can be obtained.

The surface potential tuning by the irradiation of the laser light and the adjustment of the RTD and the Dose amount can be provided by controlling these three factors together in a comprehensive manner and concurrently.

FIG. 12 shows a relationship between the laser light irradiation and the blanking signal. Although it is possible to apply the integration by all images in case of repeated image taking, alternatively the upper layer pattern image and the under layer pattern image may be taken separately, wherein the laser light irradiation amount and the potential increment in the sample surface can be fine-tuned only when taking the under layer pattern image. Alternatively, the potential increment in the sample surface by the irradiation of the laser light may be fine-tuned when taking the image of the upper layer pattern, or the laser light irradiation may be provided at any time. Further, the laser light irradiation may be provided when no image is being taken, but it is suspended or blocked during image taking.

The invention claimed is:

1. A method for inspecting a sample surface with a projection type electron beam inspection apparatus, the method characterized in comprising the steps of:
    forming such an irradiation area on the sample surface by an electron beam generated from an electron gun that has approximately a circular or elliptical shape of a size larger than a pattern on the sample surface;
    irradiating the electron beam substantially onto a center of the pattern on the sample surface; and
    forming an image on an electron detection plane of a detector from secondary electrons emanating from the sample surface in response to the irradiation of the electron beam for inspecting the sample surface.

2. A method for inspecting a sample surface in accordance with claim 1, characterized in that the detector is an EB-CCD.

3. A method for inspecting a sample surface in accordance with claim 1 or 2, characterized in that the irradiation of the electron beam onto the sample surface is carried out by deflecting the electron beam by controlling of a voltage of a blanking electrode disposed in the middle of a path of the electron beam, wherein the method comprises:
- calculating an amount of charges, i.e., dose amount, irradiated on the sample surface, by using a blanking signal obtained by the controlling of the voltage of the blanking electrode;
- calculating a variation in potential of the sample surface from a predetermined physical constant depending on the dose amount and the structure of the sample; and
- adjusting a retarding voltage (RTD) to cancel out the variation in potential.

4. A method for inspecting a sample surface in accordance with claim 3, characterized in that an irradiation point of the electron beam is shifted from the center of the pattern on the sample surface to a direction substantially opposite to the deflecting direction of the electron beam so as to eliminate a bias in a charged condition of the sample surface.

* * * * *